(12) United States Patent
Akutsu

(10) Patent No.: US 9,857,399 B2
(45) Date of Patent: Jan. 2, 2018

(54) PEAK FREQUENCY DETECTION DEVICE, METHOD, AND PROGRAM

(71) Applicant: SFFT Company Limited, Ichihara-shi, Chiba (JP)

(72) Inventor: Kazushi Akutsu, Toyoake (JP)

(73) Assignee: SFFT Company Limited, Ichihara-shi (JP)

( * ) Notice: Subject to any disclaimer, the term of this patent is extended or adjusted under 35 U.S.C. 154(b) by 0 days.

(21) Appl. No.: 15/314,614

(22) PCT Filed: Jul. 10, 2014

(86) PCT No.: PCT/JP2014/068432
§ 371 (c)(1),
(2) Date: Nov. 29, 2016

(87) PCT Pub. No.: WO2016/006079
PCT Pub. Date: Jan. 14, 2016

(65) Prior Publication Data
US 2017/0205448 A1 Jul. 20, 2017

(51) Int. Cl.
*G01R 19/04* (2006.01)
*G01R 23/00* (2006.01)

(52) U.S. Cl.
CPC .......... *G01R 19/04* (2013.01); *G01R 23/00* (2013.01)

(58) Field of Classification Search
CPC ........ G01R 19/04; G01R 23/16; G01R 23/00; H04L 2027/0026–2027/0071

(Continued)

(56) References Cited

U.S. PATENT DOCUMENTS 5,291,081 A * 3/1994 Takeuchi ............ H03L 7/00
327/113
5,799,038 A * 8/1998 Nowara ............ H04B 1/707
370/203

(Continued)

FOREIGN PATENT DOCUMENTS

CN 1143863 A 2/1997
CN 1975756 A 6/2007

(Continued)

OTHER PUBLICATIONS

Japanese Decision to Grant a Patent issued in JP 2015-509250 dated May 19, 2015.

(Continued)

*Primary Examiner* — Matthew Sandifer
(74) *Attorney, Agent, or Firm* — Sughrue Mion, PLLC

(57) ABSTRACT

A peak frequency detection device provided with: an n multiplication unit that multiplies each element of a digital data string by n (n is an integer of 2 or more); an FFT unit that derives, as a virtual peak frequency, a frequency that corresponds to the maximum value of a power spectrum that is obtained by performing a fast Fourier transform of a digital data string of N (N is an integer of a power of 2 and is determined in accordance with a sampling frequency ($f_s$), a sampling resolution ($f_{tg}$), and a time window length ($T_{tg}$)) sample frequencies ($f_s$) that are multiplied by n; and a 1/n multiplication unit that outputs the value of the virtual peak frequency multiplied by 1/n as the peak frequency of the digital data string. The peak frequency detection device satisfies $n \geq 1/(f_{tg} \times T_{tg})$, $f_s/(n \times f_{tg}) \leq N \leq f_s \times T_{tg}$, and $f_s > 2 \times n \times f_{ch}$.

11 Claims, 9 Drawing Sheets

(58) Field of Classification Search
USPC ............................. 327/39, 44–49; 375/326
See application file for complete search history.

(56) References Cited

U.S. PATENT DOCUMENTS

| | | | | |
|---|---|---|---|---|
| 5,812,611 | A | * 9/1998 | Sogabe | ............ H03J 7/04 327/47 |
| 2004/0247048 | A1 | * 12/2004 | Dimsdle | ......... H04L 27/361 375/326 |
| 2008/0310566 | A1 | * 12/2008 | Tsuruta | ......... H04L 27/0014 375/350 |
| 2013/0038486 | A1 | 2/2013 | Lee et al. | |

FOREIGN PATENT DOCUMENTS

| | | |
|---|---|---|
| EP | 0 805 573 A2 | 11/1997 |
| JP | 09-298572 A | 11/1997 |
| JP | 09298572 A * | 11/1997 |
| JP | 2008-312150 A | 12/2008 |
| JP | 2009-192516 A | 8/2009 |
| JP | 2012-247302 A | 12/2012 |
| JP | 2012-247303 A | 12/2012 |

OTHER PUBLICATIONS

Written Opinion of the International Searching Authority of PCT/JP2014/068432 dated Oct. 14, 2014.
International Search Report of PCT/JP2014/068432 dated Oct. 14, 2014.
Communication dated Jun. 1, 2017, from the State Intellectual Property Office of People's Republic of China in counterpart Application No. 201480079481.8.
Communication dated May 31, 2017, issued from the Korean Intellectual Property Office in corresponding Korean Application No. 10-2016-7033030.

* cited by examiner

【Fig1】
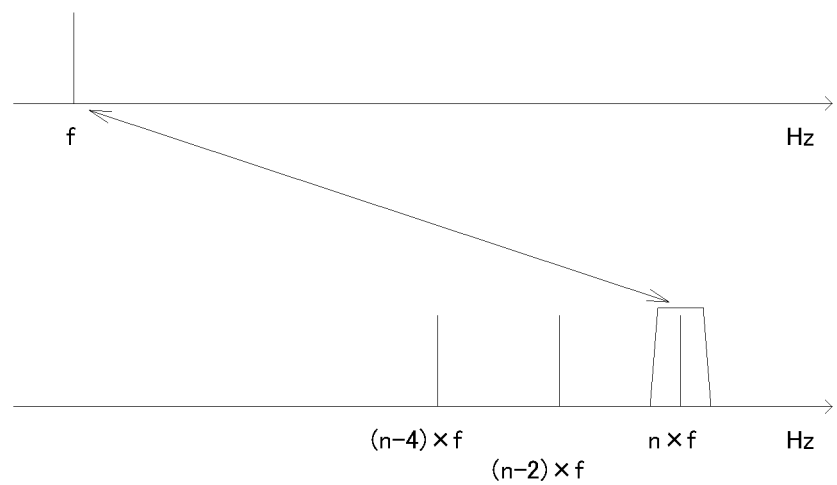

[Fig2]
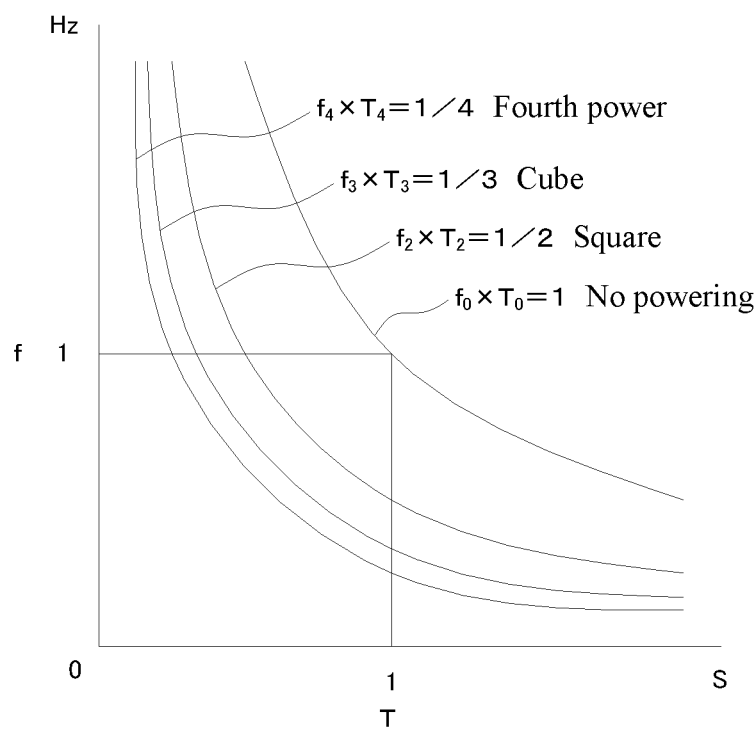

[Fig3]
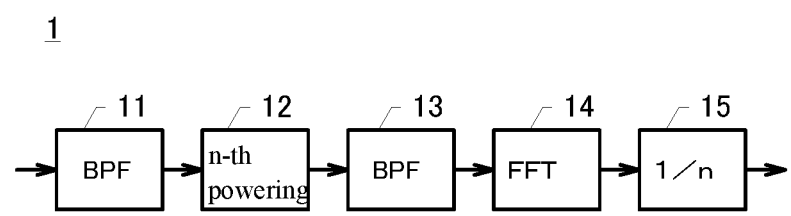

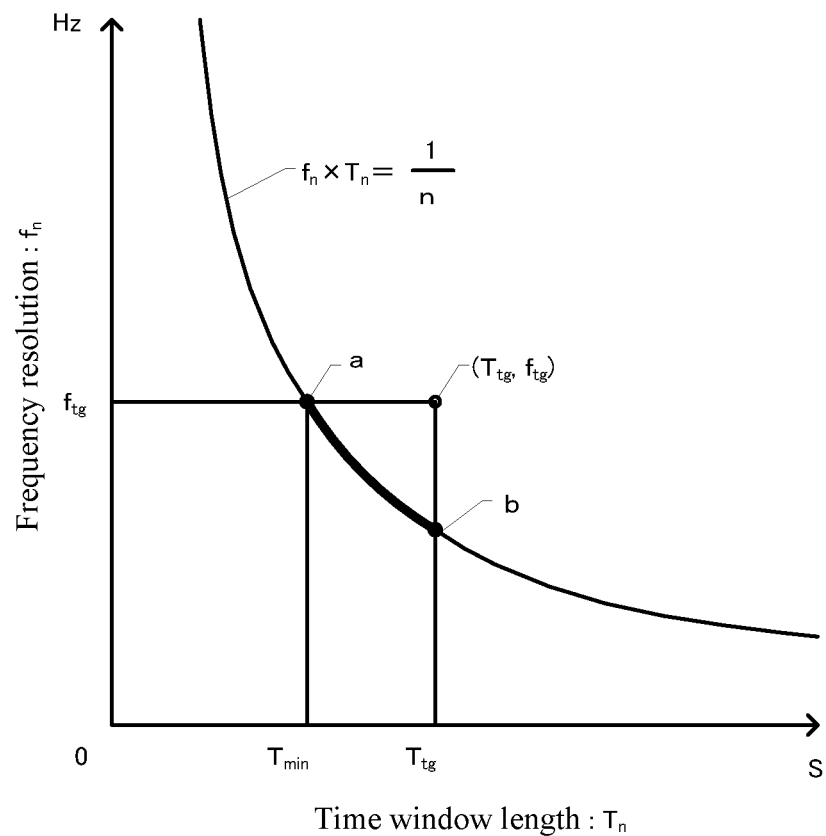

[Fig5]
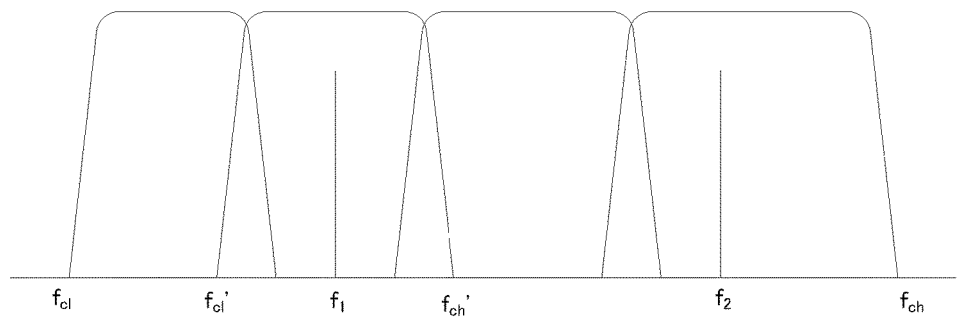
[Fig6]
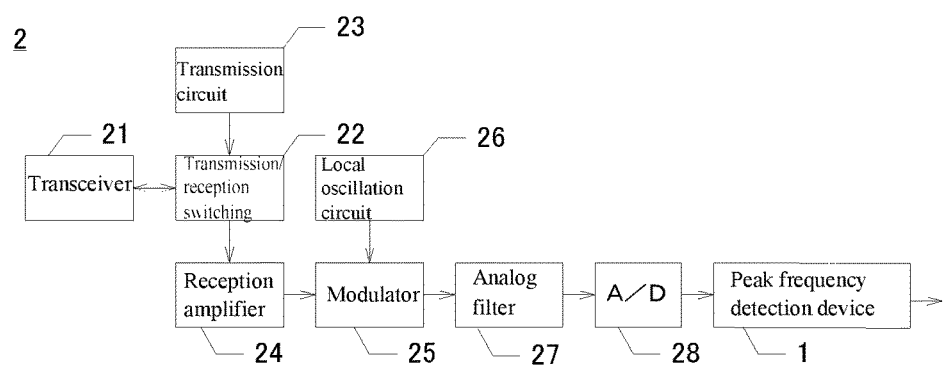
[Fig7]
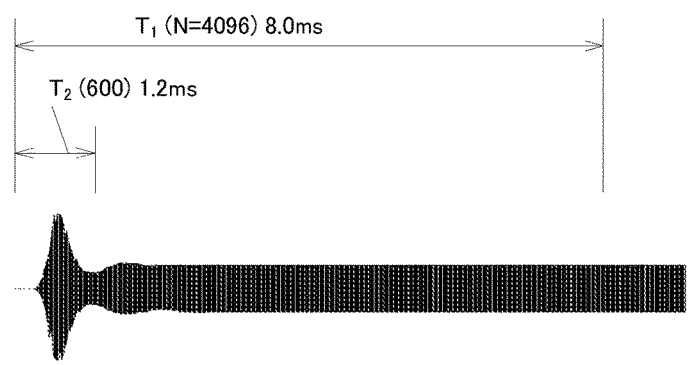

【Fig8】
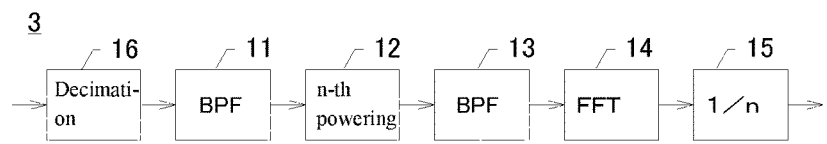
【Fig9】
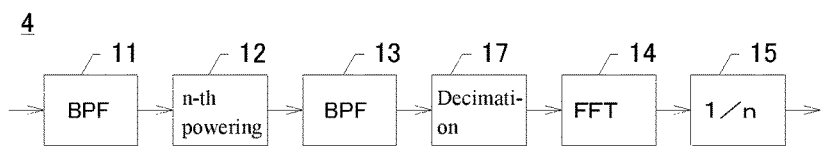
【Fig10】
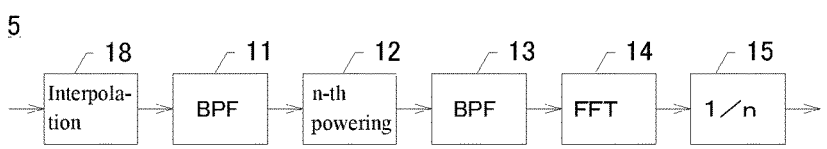
【Fig11】
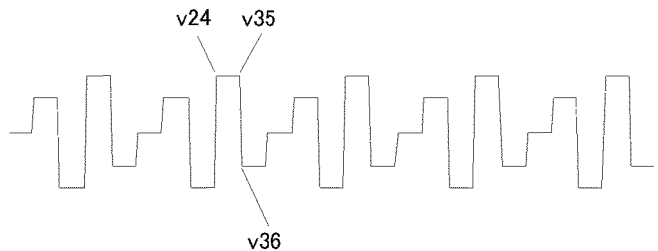

【Fig13】
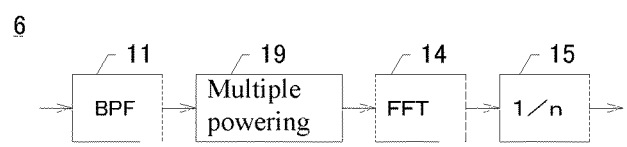
【Fig14】
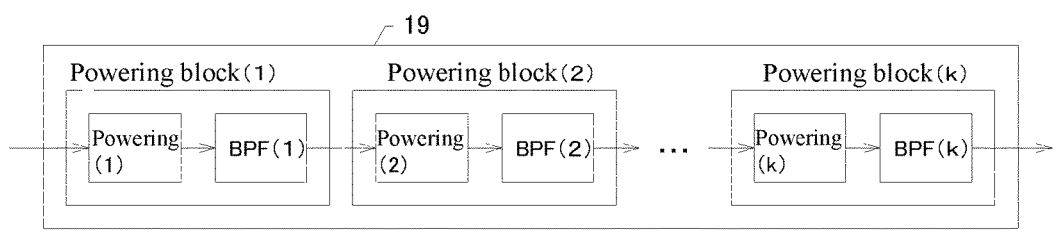

PEAK FREQUENCY DETECTION DEVICE, METHOD, AND PROGRAM

CROSS REFERENCE TO RELATED APPLICATIONS

This application is a National Stage of International Application No. PCT/JP2014/068432 filed Jul. 10, 2014, the contents of which are incorporated herein by reference in its entirety.

TECHNICAL FIELD

The present invention relates to a device, a method, and a program configured to detect a peak frequency having a maximum power spectrum.

BACKGROUND ART

Assuming that, in fast Fourier transform (FFT), $T_0$ (s) denotes a time window length, $f_s$(Hz) denotes a sampling frequency, and N (N is an integer of a power of 2) denotes a sampling number, the following relationship is established.

$$T_0 = N/f_s \quad \text{[Formula 1]}$$

The time window length has a reciprocal $f_0$ (Hz) called a frequency resolution, and satisfies the following relationship.

$$f_0 = 1/T_0 \quad \text{[Formula 2]}$$

When a signal wave is frequency-analyzed by means of FFT, a time window length corresponds to a time length of the signal wave to be subject to FFT, a frequency resolution corresponds to a minimum resolution of the frequency of the signal wave, i.e. frequency detection accuracy. Hereinafter, this time window length will also be referred to as "period for cutting out a signal wave to be subject to FFT", "a period of a signal wave to be subject to FFT", or the like. [Formula 2] indicates that a time window length and a frequency resolution in FFT have a conflicting relationship. This conflicting relationship is significantly effective on a frequency having a small frequency resolution. In a case where a frequency resolution of 0.01 (Hz) is required, a signal wave for 100 (s) as a reciprocal thereof needs to be subject to FFT. If a signal wave to be subject to FFT has a period of 0.01 (s), there is only obtained a frequency resolution of 100 (Hz) as a reciprocal thereof.

This conflicting relationship is possibly a constraint on FFT application, and various measures have been taken to avoid the constraint of the conflicting relationship. There is a conceivable method for applying FFT to a received signal wave and obtaining a peak frequency configuring a spectrum appearing in a frequency domain, and the method includes fixing a time window length $T_0$ to a predetermined value, applying FFT to each of periods cut out so as not to be overlapped with each other at intervals $T_0$ from the received signal wave (in other words, applying FFT a plurality of times), and averaging a plurality of obtained peak frequencies. This method occasionally achieves calculation of a peak frequency at a resolution higher than a frequency resolution $f_0$ obtained by FFT performed once (at small frequency intervals). However, increase in the number of FFT application causes a problem of a longer period for cutting out a signal wave to be subject to FFT in proportion to the number of cutting out times.

When FFT is applied to a digital data string, there are obtained power spectra provided with amplitude values at constant frequency intervals from 0 to N−1 (equal to the frequency resolution $f_0$) relative to a number N of samples to be subject to FFT. A frequency corresponding to the maximum power spectrum out of these power spectra will be called a peak frequency. The maximum power spectrum is specified by comparing each of the power spectra from 1 to N/2, for example, in accordance with a known method. In a case where the maximum power spectrum is obtained at a point p, a peak frequency $f_{pk}$ is expressed as $f_{pk}=p \times f_0$.

Patent Literature 1 describes a method of obtaining a peak frequency while satisfying both a frequency resolution of 12 (Hz) or less and a period for cutting out a signal wave to be subject to FFT of 10 (ms) (corresponding to a underwater position resolution of 7.5 m) or less (See [0023] to [0026] and [0089] to [0090] in this literature. Note that the period for cutting out an input signal wave changes to 5 (ms) as an exemplary numerical value from [0097], although a reason therefor is unknown.). When the frequency resolution of 12 (Hz) is prioritized, the cutting out period is obtained as $1/12$ (Hz)=83.3 (ms) in accordance with [Formula 2]. The number N of samples to be subject to FFT is required to be a power of 2. According to the literature, the signal cutting out period is set to 102.4 (ms) corresponding to N=1024 (see [0055] in the literature). In order to set a period for cutting out an input signal wave to be subject to FFT to 102.4 (ms), a period of 5 (ms) for obtaining actual data is insufficient and data of zero value is added to a section for an insufficient period 102.4−5=97.4 (ms). A data string obtained by adding the data of zero value (a section for a time length of 102.4 (ms)) is subject to FFT to obtain a peak frequency (see [0103] in the literature).

According to the method described in the literature, an effective data string included in the data string to be subject to FFT is only about $1/10$ of the entire data string (about $1/20$ according to [0103] in the literature). If a digital band pass filter (a digital BPF 62 in FIG. 7 of the literature), which is applied to a digital signal wave obtained by A/D conversion typically performed in a case where an input signal wave is an analog signal wave, is set to have a high degree and a narrow band, a signal having passed through the digital band pass filter is weakened and the volume of effective data decreases. The digital band pass filter is thus required to have a weaker filter property. The literature includes no recognition of a potential problem that it is difficult to avoid a negative influence by disturbance noise with an input signal wave having a short time length, and thus neither suggests nor teaches any solution to such a potential problem.

According to the literature, the digital signal wave (digital data string) to be subject to FFT includes actual data only in a section for about $1/10$ (or about $1/20$) of a required time window length for FFT application, so that many power spectra should be generated. When an actual signal wave to be subject to FFT includes disturbance noise, more excessive spectra will appear in the vicinity of a peak frequency. In this case, it may be difficult to specify the peak frequency.

Although various efforts have been made in order to avoid the constraint of the conflicting relationship upon obtaining a peak frequency of an input signal, there has not yet been found any universal solution.

CITATIONS LIST

Patent Literature

Patent Literature 1: JP 2012-247302 A

SUMMARY OF INVENTION

Technical Problem

It is an object of the present invention to provide a device, a method, and a program enabling detection of a peak frequency of a signal wave at a desired frequency resolution in a desired time window length while avoiding a conflicting relationship $f_0=1/T_0$ between a frequency resolution ($f_0$) and a time window length ($T_0$) as a constraint on a frequency analysis by means of FFT.

Solutions to Problem (1) In order to achieve the object mentioned above, a peak frequency detection device is configured to detect a peak frequency having a maximum power spectrum in a predetermined frequency band ($f_{cl}$ to $f_{ch}$). The device includes: an n-th powering unit configured to n-th power (n is an integer of 2 or more) each element of a digital data string; an FFT unit configured to derive, as a virtual peak frequency, a frequency corresponding to the maximum power spectrum that is obtained by applying fast Fourier transform to N (N is an integer of a power of 2 and is determined in accordance with a sampling frequency $f_s$, a frequency resolution $f_{tg}$, and a time window length $T_{tg}$) n-th powered digital data strings having the sampling frequency $f_s$; and a 1/n multiplication unit configured to output a value obtained by multiplying the virtual peak frequency by 1/n as a peak frequency of a digital data string, in which the device satisfies $$n \geq 1/(f_{tg} \times T_{tg})$$

$$f_s/(n \times f_{tg}) \leq N \leq f_s \times T_{tg}$$

$$f_s > 2 \times n \times f_{ch}.$$

In the present description, the range from $f_{cl}$ to $f_{ch}$, indicates a range from $f_{cl}$ or more to $f_{ch}$ or less.

Assuming that a signal wave y to be subject to a frequency analysis is a sine function expressed as in [Formula 3] having a single frequency f (Hz), an n-th power of y (n is a positive integer of 2 or more) is expressed as in [Formula 4] and [Formula 5]. The value n in [Formula 4] is an odd number whereas the value n in [Formula 5] is an even number.

$$y = \sin(2\pi f t) \quad \text{[Formula 3]}$$

$$\sin^n 2\pi f t = \frac{2}{2^n} \sum_{k=0}^{\frac{n-1}{2}} (-1)^{(\frac{n-1}{2}-k)} {}_n C_k \sin((n-k)2\pi f t) \quad \text{[Formula 4]}$$

$$\sin^n 2\pi f t = \frac{1}{2^n} {}_n C_{\frac{n}{2}} + \frac{2}{2^n} \sum_{k=0}^{\frac{n}{2}-1} (-1)^{(\frac{n}{2}-k)} {}_n C_k \cos((n-2k)2\pi f t) \quad \text{[Formula 5]}$$

[Formula 4] and [Formula 5] indicate that, by n-th powering y (n=2, 3, 4, . . . ), frequency components n×f, (n−2)×f, (n−4)×f, . . . appear regardless of whether n is an odd number or an even number.

When obtaining an n-th power of y=sin(2πft), extracting a signal wave having the frequency component (n×f) from signal waves thus obtained by n-th powering, and obtaining a peak frequency of the signal wave, a product of multiplying the obtained frequency by 1/n is found to correspond to the frequency f of the original signal wave. FIG. 1 schematically indicates this relationship.

Assume that $f_s$ denotes an FFT sampling frequency applied in the frequency analysis, and N denotes a sample number. A calculated value of f is equal to a peak frequency obtained by applying FFT to y=sin(2πft). The frequency resolution $f_0$ in this case is obtained as follows.

$$f_0 = f_s/N \quad \text{[Formula 6]}$$

When obtaining a peak frequency by applying FFT having $f_s$ and N equal to the values for the case of obtaining the peak frequency of y to a sine function $y_n = \sin(2\pi n f t)$ having the frequency component (n×f), a frequency $f_n'$ of $y_n$ thus obtained is a calculated value of (n×f). Note that the frequency $f_n'$ of $y_n$ is obtained at the frequency resolution $f_0$ equal to the frequency resolution for y. That is, $f_n'$ also has the frequency resolution $f_0$. Accordingly, $f_n'/n$ obtained by multiplying $f_n'$ by 1/n is the frequency f of y at a frequency resolution $f_0/n$.

Assuming that $f_0$ denotes a frequency resolution obtained by directly applying FFT to the frequency f of y, $T_0$ denotes a time window length in this case, as well as that $f_n$ denotes a frequency resolution in a case of obtaining the frequency f of y from $y_n$, and $T_n$ denotes a time window length in this case, the following expressions are obtained.

$$f_n = f_0/n \text{ (n is an integer of 2 or more)} \quad \text{[Formula 7]}$$

$$T_n = T_0 \quad \text{[Formula 8]}$$

Furthermore, the following relationship is established.

$$f_n \times T_n = (f_0/n) \times T_0 = 1/n < 1 \text{ (n is an integer of 2 or more)} \quad \text{[Formula 9]}$$

FIG. 2 includes indications in cases where n=2, 3, 4 in [Formula 9] and an indication of $f_0 \times T_0 = 1$ in a case where no power is obtained.

The frequency resolution $f_{tg}$ is a frequency resolution of a peak frequency desired by a user upon obtaining a peak frequency of the original signal wave. The time window length $T_{tg}$ is an FFT time window length desired by a user. The values $f_{tg}$ and $T_{tg}$ can be set independently.

Specifically, the present invention provides a method of calculating the peak frequency of the original signal wave under the following conditions.
the frequency resolution $f_n$ of the peak frequency satisfying $f_n \leq f_{tg}$
the FFT time window length $T_n$ satisfying $T_n \leq T_{tg}$ In accordance with [Formula 9], it is thus necessary to satisfy the following relationship.

$$f_n \times T = 1/n \leq f_{tg} \times T_{tg} \quad \text{[Formula 10]}$$

In other words, the multiplier n is required to satisfy the following relationship.

$$n \geq 1/(f_{tg} \times T_{tg}) \quad \text{[Formula 11]}$$

The value n is not limited to a power of 2, i.e. 2, 4, 8, 16, 32, . . . , but is selectable from integers of 2 or more. It is thus possible to select a necessary and sufficient optimal value in accordance with a purpose. The present invention enables detection of a peak frequency of a signal wave at a desired frequency resolution in a desired time window length while avoiding a conflicting relationship $f_0 = 1/T_0$ between a frequency resolution ($f_0$) and a time window length ($T_0$) as a constraint on the frequency analysis by means of FFT. Specifically, a peak frequency of a signal wave is detected at a desired frequency resolution in a desired time window length also in a range $f_{tg} \times T_{tg} < 1$.

The frequency resolution $f_n$ and the time window length $T_n$ of the peak frequency upon applying FFT to a digital data string obtained by n-th powering a signal wave has the relationship $f_n \times T = 1/n$ as in [Formula 9], and FIG. 4 indicates this relationship. A bold portion in the indication $f_n \times T = 1/n$ in FIG. 4 has $f_n$ and $T_n$ satisfying the requirements for $f_{tg}$ and $T_{tg}$.

Assuming that $T_{min}$ denotes the value $T_n$ in a case where $f_n = f_{tg}$ is established, the value $T_n$ is variable within the following range.

$$T_{min} \leq T_n \leq T_{tg} \quad \text{[Formula 12]}$$

Meanwhile, the following relationship is established.

$$f_{tg} \times T_{min} = 1/n \quad \text{[Formula 13]}$$

$$T_n = N/f_s$$

Accordingly, the following relationship is obtained.

$$1/(n \times f_{tg}) \leq N/f_s \leq T_{tg} \quad \text{[Formula 14]}$$

In FFT, N has to be a power of 2 and is variable within the following range.

$$f_s/(n \times f_{tg}) \leq N \leq f_s \times T_{tg} \quad (N \text{ is a power of 2})$$

If there is no N, n is increased until N is found, $f_s$ is increased, or both n and $f_s$ are increased. According to an FFT sampling theorem, the following expression needs to be satisfied.

$$f_s > 2 \times n \times f_{ch} \quad \text{[Formula 15]}$$

If there is a plurality of applicable values N, any one of these values N satisfies the desired frequency resolution $f_{tg}$ and the desired time window length $T_{tg}$. FFT has a smaller calculation amount with the smaller N, so that the adopted value N is typically preferred to be most approximate to the following value.

$$f_s/(n \times f_{tg}) \quad \text{[Formula 16]}$$

In this manner, it is possible to determine the multiplier n, the FFT sampling frequency $f_s$, and the FFT sample number N that enable detection of a peak frequency at the desired frequency resolution $f_{tg}$ in the desired time window length $T_{tg}$ also in the range $f_{tg} \times T_{tg} < 1$. Determination of the values n, $f_s$, and N is not required to follow the procedure described above. Trials and errors can be repeated by random application of numerical values until the conditions are satisfied, a simple program can be built up to derive appropriate values, or any other measure can be taken.

(2) In order to achieve the object mentioned above, optionally, the peak frequency detection device further includes a first digital band pass filter configured to extract a digital data string having a frequency included in the predetermined frequency band, in which the n-th powering unit receives an output from the first digital band pass filter.

If this configuration is adopted, a signal in the predetermined frequency band is extracted from signals including various frequency components. Therefore, an analog filter foregoingly provided can be simplified or eliminated for circuit size reduction.

(3) In order to achieve the object mentioned above, optionally, the peak frequency detection device further includes a decimation unit configured to decimate a digital data string having a sampling frequency $f_{is}$ to $1/r$ (r is an integer of 2 or more) to obtain the sampling frequency $f_s$, in which the first digital band pass filter receives an output from the decimation unit.

If this configuration is adopted, the peak frequency is detected at the desired frequency resolution $f_{tg}$ in the desired time window length $T_{tg}$ even in a case where the sampling frequency of the digital data string input to the peak frequency detection device is larger than $f_s$.

(4) In order to achieve the object mentioned above, optionally, the peak frequency detection device further includes an interpolation unit configured to interpolate the received digital data string by g (g is an integer of 2 or more) to obtain the sampling frequency $f_s$, in which the first digital band pass filter receives an output from the interpolation unit.

If this configuration is adopted, the peak frequency is detected at the desired frequency resolution $f_{tg}$ in the desired time window length $T_{tg}$ even in a case where the sampling frequency of the digital data string input to the peak frequency detection device is smaller than $f_s$.

(5) In order to achieve the object mentioned above, optionally, the peak frequency detection device further includes a second digital band pass filter configured to extract a digital data string included in a second frequency band from the N n-th powered digital data strings, in which the FFT unit receives the digital data string extracted by the second digital band pass filter, and the second frequency band is substantially from $n \times f_{cl}$ to $n \times f_{ch}$.

Even in a case where the digital data string includes a single frequency component, there is obtained a plurality of frequency components by n-th powering the digital data string and a plurality of peaks thus appears in the power spectrum. The peak to be detected appears in the band from $n \times f_{cl}$ to $n \times f_{ch}$, corresponding to the band from $f_{cl}$ to $f_{ch}$. Extraction of the components in the band from $n \times f_{cl}$ to $n \times f_{ch}$, enables detection of the peak frequency having the maximum power spectrum in the predetermined frequency band ($f_{cl}$ to $f_{ch}$). There is no need to provide the second digital band pass filter if the peak frequency to be detected can be specified and selected from a plurality of peak frequencies.

(6) In order to achieve the object mentioned above, optionally, the peak frequency detection device further includes a decimation unit configured to decimate the digital data string extracted by the second digital band pass filter to $1/r$ (r is an integer of 2 or more) to obtain the sampling frequency $f_s$, in which the FFT unit receives an output from the decimation unit.

If this configuration is adopted, the peak frequency is detected at the desired frequency resolution $f_{tg}$ in the desired time window length $T_{tg}$ even in a case where the sampling frequency of the digital data string input to the peak frequency detection device is larger than $f_s$.

(7) In order to achieve the object mentioned above, optionally, the peak frequency detection device further includes: a first digital band pass filter configured to extract a digital data string having a frequency included in the specific frequency band; and a second digital band pass filter configured to extract a digital data string included in a second frequency band from an output from the n-th powering unit, in which the n-th powering unit receives an output from the first digital band pass filter, the FFT unit receives an output from the second digital band pass filter, and the second frequency band is substantially from $n \times f_{cl}$ to $n \times f_{ch}$.

(8) In order to achieve the object mentioned above, optionally, the peak frequency detection device includes, in place of the n-th powering unit, a multiple powering unit including k (k is an integer of 2 or more) powering blocks (j) (j=1, 2, . . . , and k) provided with powering units (j) each configured to $m_j$-th power a received digital data string, and digital band pass filters (j) each configured to extract a signal in a specific frequency band from $f_{cl}(j)$ to $f_{ch}(j)$ from an output from the corresponding powering unit (j), respectively, in which the device satisfies $$n = m_1 \times m_2 \times \ldots \times m_k$$

$$f_{cl}(j) \approx (m_1 \times m_2 \times \ldots \times m_j) \times f_{cl}$$

$$f_{ch}(j) \approx (m_1 \times m_2 \times \ldots \times m_j) \times f_{ch}.$$

When a digital data string is powered, a smaller multiplier leads to fewer excessive frequency components generated by powering. As there are fewer excessive frequency components, the digital band pass filter excludes the excessive frequency components more easily. Specifically, the multiplier n processable with a multiple sets of powering units and digital band pass filters has an upper limit larger than an upper limit of the multiplier n processable with the single powering unit and the second digital band pass filter. Adoption of this configuration can widen the range of the applicable multiplier n.

(9) In order to achieve the object mentioned above, optionally, the peak frequency detection device further includes: an operation unit configured to receive a user command; and a parameter setting unit configured to set at least one of values n, $f_s$, and N according to the command.

Adoption of this configuration does not require a user to set, through repeated trials and errors, the values n, $f_s$, and N satisfying the following expressions.

$$n \geq 1/(f_{tg} \times T_{tg})$$

$$f_s/(n \times f_{tg}) \leq N \leq f_s \times T_{tg}$$

$$f_s > 2 \times n \times f_{ch}$$

Functions of the units recited in the claims are each achieved by a hardware resource having a function specified by its configuration, a hardware resource having a function specified by a program, or combination thereof. The functions of these units are not limited to be achieved by hardware resources physically independent from each other. Further, the present invention is achieved by a method, a computer program, or a recording medium for the computer program. The recording medium for the computer program is embodied by a magnetic recording medium, a magneto-optical recording medium, or any recording medium to be developed in the future.

BRIEF DESCRIPTION OF DRAWINGS

FIG. 1 is a spectrogram according to an embodiment of the present invention.

FIG. 2 is a graph according to the embodiment of the present invention.

FIG. 3 is a block diagram according to the embodiment of the present invention.

FIG. 4 is a graph according to the embodiment of the present invention.

FIG. 5 is a spectrogram according to the embodiment of the present invention.

FIG. 6 is a block diagram according to the embodiment of the present invention.

FIG. 7 is a waveform chart according to the embodiment of the present invention.

FIG. 8 is a block diagram according to the embodiment of the present invention.

FIG. 9 is a block diagram according to the embodiment of the present invention.

FIG. 10 is a block diagram according to still another embodiment of the present invention.

FIG. 11 is a waveform chart according to the embodiment of the present invention.

FIG. 13 is a block diagram according to still another embodiment of the present invention.

FIG. 14 is a block diagram according to the embodiment of the present invention.

DESCRIPTION OF EMBODIMENTS

Figure 12A:
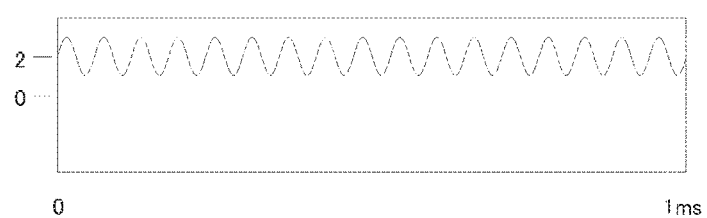
FIGS. 12A to 12C are waveform charts according to the embodiment of the present invention.

Embodiments of the present invention will now be described below with reference to the accompanying drawings. Corresponding constituent elements in the drawings will be denoted by an identical reference sign and will not be described repeatedly.

1. First Embodiment

Described in a first embodiment are a peak frequency detection device and a Doppler measuring instrument including the same. The peak frequency detection device is configured to detect a peak frequency f in a frequency band from $f_{cl}$ to $f_{ch}$ determined by a lower limit value $f_{cl}$ and an upper limit value $f_{ch}$ of a received digital data string sampled at a sampling frequency $f_s$ while satisfying a desired frequency resolution $f_{tg}$ and a desired time window length $T_{tg}$.

As depicted in FIG. 3, a peak frequency detection device 1 according to the first embodiment of the present invention includes a first digital band pass filter (BPF) unit 11, an n-th powering unit 12, a second digital band pass filter (BPF) unit 13, an FFT unit 14, and a 1/n multiplication unit 15.

Initially described is a procedure of determining a multiplier n, an FFT sampling frequency $f_s$ applied in a frequency analysis, and an FFT sampling number N applied in the frequency analysis.

(Step 1. Set Multiplier n)

Determined first is n (n is an integer of 2 or more) satisfying a condition $n \geq 1/(f_{tg} \times T_{tg})$. For example, n is set to have a minimum integer satisfying $n \geq 1/(f_{tg} \times T_{tg})$. If there is no N in step 3 to be described later, n is increased by 1 for recalculation. Alternatively, n is initially set to a rather large value.

(Step 2. Select FFT Sampling Frequency $f_s$)

The FFT sampling frequency $f_s$ is selected to satisfy the following expression in order to satisfy a sampling theorem.

$$f_s > 2 \times n \times f_{ch}$$

The sampling frequency of the digital data string input to the peak frequency detection device 1 corresponds to the FFT sampling frequency $f_s$ in the present embodiment. If $f_s$ does not satisfy the above expression due to a circuit constraint or the like, one of other embodiments is to be applied.

(Step 3. Set FFT Sample Number N)

Subsequently selected is N satisfying $f_s/(n \times f_{tg}) \leq N \leq f_s \times T_{tg}$ (N is a power of 2). If there is no N, n is increased, $f_s$ is increased, or both n and $f_s$ are increased until N is found. According to the FFT sampling theorem, the following expression needs to be satisfied.

$$f_s > 2 \times n \times f_{ch}$$

The values n, $f_s$, and N selected in the manners described above are set to the n-th powering unit 12 and the FFT unit 14. The lower limit value $f_{cl}$ and the upper limit value $f_{ch}$ in the band for peak frequency detection are set as cutoff frequencies of the first digital BPF 11. Values obtained by multiplying by n the lower limit value $f_{cl}$ and the upper limit value $f_{ch}$ in the band for peak frequency detection are set as cutoff frequencies of the second digital BPF 13.

(Calculate Peak Frequency From Digital Data String)

When the peak frequency detection device 1 having the set values n, $f_s$, and N receives a target digital data string, the peak frequency detection device 1 detects a peak frequency satisfying the desired frequency resolution $f_{tg}$ and the desired time window length $T_{tg}$ in the following manner.

When the peak frequency detection device 1 receives the target digital data string, the first digital BPF 11 excludes excessive DC components, low-frequency components, and high-frequency components outside the set band from various frequency components of the digital data string and extracts a frequency component approximate to a single frequency f.

In a case where the band from $f_{cl}$ to $f_{ch}$ for peak frequency detection is too wide and includes a plurality of large power spectra, the band from $f_{cl}$ to $f_{ch}$ is narrowed and a peak frequency is obtained by detecting several times as indicated in FIG. 5. FIG. 5 exemplarily indicates the initial frequency band from $f_{cl}$ to $f_{ch}$, two frequencies $f_1$ and $f_2$ each having a large power spectrum, and a narrowed frequency band from $f_{cl}'$ to $f_{ch}'$. The interval between $f_{cl}'$ and $f_{ch}'$ is not necessarily constant, and may be widened as the frequency increases as indicated in FIG. 5.

The digital data string having passed through the first digital BPF 11 is denoted by A(1): $a_0, a_1, a_2, \ldots$. The digital data string A(1) includes the frequency f as well as a few excessive frequency components each having a small power spectrum.

Subsequently, A(1) is input to the n-th powering unit 12. The n-th powering unit 12 powers each element of A(1) by applying the multiplier n set earlier. The digital data string having passed through the n-th powering unit 12 is denoted by B(n): $b_0, b_1, b_2, \ldots$, and the expression $b_i=(a_i)^n$ (i=0, 1, 2, 3, 4, ...) is established. The digital data string B(n) includes frequency components $n \times f, (n-2) \times f, (n-4) \times f, \ldots$, as well as excessive low-frequency components and high-frequency components each having a small power spectrum.

The digital data string B(n) is subsequently input to the second digital BPF 13 for extraction of a frequency component in a band from $n \times f_{cl}$ to $n \times f_{ch}$. The second digital BPF 13 is configured to exclude excessive low-frequency components and high-frequency components from various frequency components of the digital data string B(n) and extract a frequency component approximate to a single frequency. The second digital BPF 13 preferably has the frequency band from $n \times f_{c1}$ to $n \times f_{ch}$ obtained by multiplying the frequency band of the first digital BPF 11 by n, but can slightly be varied in accordance with a purpose. The digital data string having passed through the second digital BPF 13 is denoted by C(n): $c_0, c_1, c_2, \ldots$. The digital data string C(n) includes the frequency $n \times f$ as well as a few excessive frequency components.

The digital data string input to the peak frequency detection device 1 has the sampling frequency $f_s$ satisfying the relationship $f_s > 2 \times n \times f_{ch}$ because the digital data string C(n) has a frequency band with an upper limit $n \times f_{ch}$. In other words, the sampling frequency $f_s$ of the received digital data string is required to satisfy the FFT sampling theorem.

The digital data string C(n) is subsequently input to the FFT unit 14 for peak frequency calculation. The FFT unit 14 applies FFT to the digital data string C(n) at the sampling frequency $f_s$ and the sample number N having been set earlier and calculates a peak frequency. The peak frequency output from the FFT unit 14 is denoted by (n×f').

The 1/n multiplication unit 15 subsequently receives the peak frequency (n×f') output from the FFT unit 14 to obtain f'. The value f' thus obtained is a calculated value of the peak frequency f of the digital data string input to the peak frequency detection device 1. The value f' is calculated while satisfying the values $f_{tg}$ and $T_{tg}$.

As described above, the peak frequency detection device 1 is configured to detect a peak frequency at the desired frequency resolution $f_{tg}$ in the desired time window length $T_{tg}$ from a received digital data string. The peak frequency detection device 1 does not perform approximation calculation, so that a calculated peak frequency has no accuracy deterioration. The peak frequency can be thus detected highly accurately.

FIG. 6 is a block diagram depicting a Doppler measuring instrument 2 incorporating the peak frequency detection device 1. The Doppler measuring instrument 2 includes a transceiver 21 having a function of transmitting a signal wave into a medium as well as a function of receiving a reflected wave from a target object in the medium. The transceiver 21 is connected to an output terminal of a transmission circuit 23 and an input terminal of a reception amplifier 24 via a transmission/reception switch circuit 22. The transmission circuit 23 is configured to generate a signal having a transmission frequency $f_{tx}$. The reception amplifier 24 has an output terminal provided with a modulator 25 configured to convert a frequency of a received signal to an intermediate frequency signal. The modulator 25 is supplied with a signal having a local oscillation frequency $f_{loc}$ from a local oscillation circuit 26. An output from the modulator 25, i.e. the intermediate frequency signal, is transmitted, via an analog filter 27, to an analog/digital (A/D) converter 28, and is converted to a digital signal at a sampling frequency required for FFT. The peak frequency detection device 1 subsequently receives the digital signal, performs the frequency analysis by means of FFT, and outputs a peak frequency.

Described in the present embodiment is a method of detecting a peak frequency of a sonic wave in sea water under the following conditions.

sonic wave propagation speed C in sea water: 1500 m/s
transmission frequency $f_{tx}$: 120 kHz
local oscillation frequency $f_{loc}$: 137 kHz
detected maximum speed (in the horizontal direction) V: 15 m/s
detected speed accuracy (in the horizontal direction) $V_0$: 0.15 m/s
positional accuracy of a detection target object (a position resolution) $D_0$: 7.5 m The sonic wave is assumed to be transmitted and received in a direction slanting (at θ=60 degrees) from the horizontal direction. When C>>V is established, a Doppler frequency $f_{dop}$ is obtained as follows.

$$f_{dop} = \frac{2 \times f_{tx} \times V \times \cos\theta}{C} \qquad \text{[Formula 17]}$$

The detected maximum speed V is 15 m/s, so that the following expression is established.

$$f_{dop} = \frac{2 \times 120000 \times 15 \times 0.5}{1500} = 1200 (\text{Hz}) \qquad \text{[Formula 18]}$$

A Doppler signal is in the range 120±1.2 kHz, and an observed frequency band has a width $\Delta f_p$ calculated as follows.

$\Delta f_p = 2 \times 1200 \text{ Hz} = 2400 \text{ Hz}$

Assume that an intermediate frequency $f_{mid}$ is calculated as $f_{loc}-f_{tx}=137-120=17$ kHz. The analog filter 27 is configured to allow a signal expressed as $$f_{mid} \pm (\Delta f_p/2) = 17000 \pm 1200 \text{ Hz}$$

to pass therethrough and generate no aliasing at the subsequently provided A/D converter 28.

The detected speed accuracy $V_0$ is 0.15 m/s, so that the following expression is established.

$$f_{dop} = \frac{2 \times 120000 \times 0.15 \times 0.5}{1500} = 12 \text{(Hz)} \qquad \text{[Formula 19]}$$

The frequency resolution $f_0$ is thus 12 Hz.

The detection target object has the positional accuracy (the position resolution) of 7.5 m, so that a time window length is obtained as 7.5×2/1500=10 ms as a period for reciprocating the distance 7.5 m.

This condition cannot be satisfied by applying FFT directly to an output from the analog/digital (A/D) converter 28. In a case where the frequency resolution is 12 Hz, the time window length is obtained as 1/12=83.3 ms (>10 ms) and the position resolution is obtained as 0.0833×1500/2=62.5 m (>7.5 m). In another case where the time window length is 10 ms, the frequency resolution is obtained as 1/0.01=100 Hz (>12 Hz).

Accordingly, a peak frequency is obtained using the peak frequency detection device 1 including the n-th powering unit 12 and the 1/n multiplication unit 15. Assuming that the desired frequency resolution $f_{tg}$ is 12 Hz and the desired time window length $T_{tg}$ is 10 ms, the multiplier n satisfies the following relationship.

$$n \geq 1/(f_{tg} \times T_{tg}) = 1/(12 \times 0.01) = 8.3$$

Assume that n=12 in this case.

The sampling frequency $f_s$ of the A/D converter 28 is subsequently determined. The frequency band from $f_{cl}$ to $f_{ch}$ of the first digital BPF 11 is set as $f_{cl}$=15800 Hz and $f_{ch}$=18200 Hz by conforming to 17000±1200 Hz. The sampling frequency $f_s$ of the A/D converter 28 thus satisfies the following relationship.

$$f_s > 2 \times n \times f_{ch} = 2 \times 12 \times 18200 = 436800 \text{ Hz}$$

Assume that $f_s$=510 kHz in this case.

The FFT sample number N is an integer of a power of 2 satisfying $f_s/(n \times f_{tg}) \leq N \leq f_s \times T_{tg}$, i.e. 510000 Hz/(12×12 Hz)=3541.7≤N≤510000 Hz×0.01 s=5100.

In short, $$N=4096$$

is obtained.

The sampling frequency $f_s$ and the sample number N are determined in these manners, and the digital data string output from the analog/digital (A/D) converter 28 is input to the peak frequency detection device 1.

Preferably applicable as the first digital BPF 11 is a Butterworth infinite impulse response (IIR) filter having the degree of 8 and cutoff frequencies set to $f_{cl}$=15.8 kHz and $f_{ch}$=18.2 kHz, for example. Preferably applicable as the second digital BPF 13 is a Butterworth IIR filter having the degree of 8 and the cutoff frequencies set to 189.6 kHz (12×$f_{cl}$) and 218.4 kHz (12×$f_{ch}$), for example.

Assume that a target object has relative moving speed (in the horizontal direction) V of 10 m/s and a sonic wave is transmitted and received in a direction slanting (at α=60 degrees) from the horizontal direction.

The Doppler frequency $f_{dop}$ of a received signal wave is obtained as follows.

$$f_{dop} = \frac{2 \times 120000 \times 10 \times 0.5}{1500} = 800 \text{(Hz)} \qquad \text{[Formula 20]}$$

A spurious digital data string is prepared assuming that sin{2π(17000+800)t}=sin(2π17800t) is an input signal to the A/D converter 28 at the sampling frequency of 510 kHz. A peak frequency is actually obtained, with the above setting, as (12×f')≈213662.1 Hz. The value f' to be obtained is calculated as f'=(12×f')/12=213662.1/12≈17805.2 Hz. The value f' is calculated while satisfying the value $f_{tg}$. This digital data string has a measurement error ε actually obtained as ε=f'−17800=5.2 Hz within the range of ±($f_{tg}$)/2=±6 Hz. The peak frequency at the frequency resolution $f_0$ appears at a closest point with the interval $f_0$, so that the peak frequency at the frequency resolution $f_0$ has an error within the range of ±($f_0$/2).

FIG. 7 indicates an exemplary digital data string output from the second digital BPF 13 in the present embodiment. In FIG. 7, FFT lasts for a section $T_1$. Furthermore, it takes a section $T_2$ until the digital data string has settled amplitude. The section $T_1$ includes 4096 elements and thus has a section length of 4096/510000≈8.0 ms that satisfies the desired time window length $T_{tg}$=10 ms.

FFT is applied more preferably to the digital data string after the amplitude is settled in the section $T_2$. The section $T_2$ includes about 600 elements and thus has a section length 600/510000≈1.2 ms. Because the multiplier n is set to a rather large value of 12, a necessary time length of the digital data string for peak frequency calculation is 1.2+8.0=9.2 ms not more than $T_{tg}$=10 ms. The value f' is calculated to obtain the equal value f'≈17805.2 Hz even in a case where FFT is applied to the digital data string including 4096 elements in and after the section $T_2$ in the present embodiment.

In this way, increasing the multiplier n achieves satisfying $T_{tg}$ with a margin. The first digital BPF 11 and the second digital BPF 13 can have larger degrees to achieve steepness for durability against exogenous noise. It is easily found that the frequency analysis can be performed at the desired frequency resolution $f_{tg}$ by increasing the multiplier n even in a case where $T_{tg}$ is 5 ms.

Described next is why the first digital BPF 11 functioning as a band pass filter is provided. In order to apply [Formula 4] and [Formula 5], excessive DC components, low-frequency components, and high-frequency components outside the frequency band from $f_{cl}$ to $f_{ch}$ need to be excluded prior to n-th powering. If the analog filter 27 is configured to exclude such components, there is no need to provide the first digital BPF 11. However, such an analog filter is expensive due to a high degree, high accuracy, and a large circuit size. It is thus appropriate to provide the analog filter 27 designed to generate no aliasing at the A/D converter 28 and a digital band pass filter easily designed to have a high degree and high accuracy for a low cost and configured to extract components in the frequency band from $f_{cl}$ to $f_{ch}$.

2. Second Embodiment

FIG. 8 is a block diagram depicting a configuration of a peak frequency detection device 3 according to a second embodiment of the present invention. The peak frequency detection device 3 additionally includes a decimation unit 16 provided ahead of the first digital BPF 11 in the peak frequency detection device 1. The decimation unit 16 is provided for decreasing the sampling frequency by decimating an A/D converted digital data string to decrease. In a case where the sampling frequency $f_s$ of a digital data string input to the peak frequency detection device 3 is high and the multiplier n and a cutoff frequency $f_{ch}$ of the first digital BPF 11 satisfy the relationship $f_s > 4 \times n \times f_{ch}$, the second embodiment is preferably applicable.

The decimation unit 16 decimates the digital data string to 1/r (r is an integer of 2 or more) and causes the decimated digital data string to satisfy the following relationship.

$$f_s > 2 \times n \times f_{ch}$$

In this expression, $f_s$ denotes a sampling frequency after decimation.

Decimation to 1/r is performed in the following exemplary manner. The digital data string prior to decimation is denoted by P(1): $p_0, p_1, p_2, \ldots$ and the decimated digital data string is denoted by Q(1): $q_0, q_1, g_2, \ldots$. In this case, the decimation unit 16 performs decimation to satisfy the relationship $q_i = p_{(r \times i)}$ (i=0, 1, 2, 3, 4, ...). In a case where r=2, the decimation unit 16 performs decimation to satisfy the relationships $q_0 = p_0$, $q_1 = p_2$, $q_2 = p_4$, and $q_3 = p_6$.

Decimation is optionally performed in a manner other than the above. For example, when r=2, the decimation unit 16 alternatively performs decimation to satisfy the relationships $q_0 = (p_0 + p_1)/2$, $q_1 = (p_2 + p_3)/2$, $q_2 = (p_4 + p_5)/2$, ....

Assuming that r=2, if there is no N satisfying $$f_s / (n \times f_{tg}) \leq N \leq f_s \times T_{tg} \text{ (N is a power of 2)}$$

and n cannot be increased, the present embodiment is not applicable. Instead, the first embodiment is applicable in this case.

Described below is a case where the peak frequency detection device 3 according to the present embodiment is applied to the Doppler measuring instrument 2 depicted in FIG. 6. Necessary numerical data other than the following numerical data is assumed to have the exemplary numerical values according to the first embodiment. Assuming that the A/D converter 28 has the sampling frequency of 10.2 MHz to satisfy $f_s = 510$ kHz as in the first embodiment for easier description hereinafter, a received digital data string input to the decimation unit 16 has a sampling frequency $f_{is}$ obtained as 10.2 MHz.

In this case, the value $f_{is}$ is obtained as $f_{is} = 10.2$ MHz $> 4 \times n \times f_{ch} = 4 \times 12 \times 18.2$ kHz=873.6 kHz. Meanwhile, $2 \times n \times f_{ch} = 2 \times 12 \times 18.2$ kHz=436.8 kHz is established. The received digital data is assumed to be decimated to 1/r=1/20. When the digital data string thus decimated is assumed to have the sampling frequency $f_s$, the following is obtained.

$$f_s = f_{is}/r = 10.2 \text{ MHz}/20 = 510 \text{ kHz} > 436.8 \text{ kHz}$$

The digital data string prior to decimation is denoted by P(1): $p_0, p_1, p_2, \ldots$ and the decimated digital data string is denoted by Q(1): $q_0, q_1, g_2, \ldots$. The decimation unit 16 then performs decimation to satisfy the relationships $q_0 = p_0$, $q_1 = p_{20}$, $q_2 = p_{40}$, $q_3 = p_{60}$, ....

This digital data string Q(1) is found to be equivalent to a signal string obtained by A/D converting an input signal at the sampling frequency $f_s = 510$ kHz. The FFT sampling frequency $f_s$ is thus obtained as $f_s = 510$ kHz.

As in the first embodiment, a spurious digital data string is prepared assuming that $y = \sin(2\pi 17800t)$ is an input signal to the A/D converter 28 at the sampling frequency of 10.2 MHz, and the frequency analysis is actually performed with the setting according to the above embodiment to obtain the exemplary numerical values of the first embodiment satisfying the values $f_{tg}$ and $T_{tg}$.

3. Third Embodiment

FIG. 9 is a block diagram depicting a configuration of a peak frequency detection device 4 according to a third embodiment of the present invention. The peak frequency detection device 4 additionally includes a decimation unit 17 subsequently to the second digital BPF 13 according to the first embodiment. The first digital BPF unit 11, the n-th powering unit 12, and the second digital BPF 13 operate similarly with input digital data having the sampling frequency $f_{is}$ replacing the sampling frequency $f_s$ of the first embodiment. In a case where the sampling frequency $f_s$ of a received digital data string is high and the multiplier n and the cutoff frequency $f_{ch}$ of the first digital BPF 11 satisfy the relationship $f_s > 4 \times n \times f_{ch}$, it is typically preferred to apply the second embodiment for a fewer calculation amount. Meanwhile, the present embodiment also achieves processing satisfying the desired time window length $f_{tg}$ and the desired time window length $T_{tg}$.

The decimation unit 17 decimates the received digital data string to 1/r (r is an integer of 2 or more) and causes the decimated digital data string having the sampling frequency $f_s$ to satisfy the following relationship.

$$f_s > 2 \times n \times f_{ch}$$

The decimated digital data string is input to the FFT unit 14. Subsequent processing is performed as in the first embodiment.

The present embodiment is not applicable if r≥2 and $f_s / (n \times f_{tg}) \leq N \leq f_s \times T_{tg}$ (N is a power of 2) are not satisfied. Instead, the first embodiment is applicable in this case.

Described below is a case where the peak frequency detection device 4 according to the present embodiment is applied to the Doppler measuring instrument 2 depicted in FIG. 6. Necessary numerical data other than the following numerical data is assumed to have the exemplary numerical values according to the first embodiment. In a case where the A/D converter 28 has the sampling frequency of 10.2 MHz, the received digital data string input to the decimation unit 17 has the sampling frequency $f_{is}$ obtained as 10.2 MHz.

In this case, the value $f_{is}$ is obtained as $f_{is} = 10.2$ MHz $> 4 \times n \times f_{ch} = 4 \times 12 \times 18.2$ kHz=873.6 kHz. Meanwhile, $2 \times n \times f_{ch} = 2 \times 12 \times 18.2$ kHz=436.8 kHz is established. Digital data having passed through the second digital BPF 13 is assumed to be decimated to 1/r=1/20. When the digital data string thus decimated is assumed to have the sampling frequency $f_s$, the following is obtained.

$$f_s = f_{is}/r = 10.2 \text{ MHz}/20 = 510 \text{ kHz} > 436.8 \text{ kHz}$$

The FFT sampling frequency $f_s$ is obtained as $f_s = 510$ kHz.

Similarly to the exemplary numerical values according to the first embodiment, a spurious digital data string is prepared assuming that $y = \sin(2\pi 17800t)$ is an input signal to the A/D converter 28 at the sampling frequency of 10.2 MHz. The frequency analysis is actually performed with the setting according to the above embodiment to obtain the exemplary numerical values of the first embodiment satisfying the values $f_{tg}$ and $T_{tg}$.

4. Fourth Embodiment

FIG. 10 is a block diagram depicting a configuration of a peak frequency detection device 5 according to a fourth embodiment of the present invention. The peak frequency detection device 5 additionally includes an interpolation unit 18 provided ahead of the digital BPF 11 according to the first embodiment. Adding the interpolation unit 18 achieves interpolating to increase an A/D converted digital data string for increase in sampling frequency. In a case where the sampling frequency $f_s$ of a digital data string input to the peak frequency detection device 5 is low and the multiplier n and the higher cutoff frequency $f_{ch}$ of the first digital BPF 11 satisfy the relationship $2 \times f_{ch} < f_s < 2 \times n \times f_{ch}$, the present embodiment is applicable.

The interpolation unit 18 interpolates a received digital data string by g (g is an integer of 2 or more) to cause the interpolated digital data string to have the sampling frequency $f_s$ satisfying the relationship $f_s > 2 \times n \times f_{ch}$. The digital data string prior to interpolation is denoted by U(1): $u_0, u_1, u_2, \ldots$ and the interpolated digital data string is denoted by V(1): $v_0, v_1, v_2, \ldots$. The interpolation unit 18 performs interpolation to satisfy the following relationships.

$$v_i = u_0 \ (i = 0, 1, 2, 3, \ldots, \text{and } (g-1))$$

$$v_i = u_1 \ (i = g, g+1, g+2, g+3, \ldots, \text{and } (2g-1))$$

$$v_i = u_2 \ (i = 2g, 2g+1, 2g+2, 2g+3, \ldots, \text{and } (3g-1))$$

In a case where g=2, the interpolation unit 18 performs interpolation to satisfy the relationships $v_0 = u_0$, $v_1 = u_0$, $v_2 = u_1$, $v_3 = u_1$, $v_4 = u_2$, $v_5 = u_2$, .... Interpolation is optionally performed in a manner other than the above. When g=2, interpolation can be performed to satisfy the following relationships.

$$v_0 = u_0$$

$$v_1 = (u_0 + u_1)/2$$

$$v_2 = u_1$$

$$v_3 = (u_1 + u_2)/2$$

$$v_4 = u_2$$

$$v_5 = (u_2 + u_3)/2$$

Described below is a case where the peak frequency detection device 5 according to the present embodiment is applied to the Doppler measuring instrument 2 depicted in FIG. 6. Necessary numerical data other than the following numerical data is assumed to have the exemplary numerical values according to the first embodiment. For easier description, the A/D converter 28 is set to have the sampling frequency of 42.5 kHz to satisfy $f_s$=510 kHz as in the first embodiment. A received digital data string input to the interpolation unit 18 has the sampling frequency $f_{is}$ of 42.5 kHz.

The following relationships are satisfied in this case.

$$2 \times f_{ch} = 2 \times 18.2 \text{ kHz} = 36.4 \text{ kHz}$$

$$2 \times n \times f_{ch} = 2 \times 12 \times 18.2 \text{ kHz} = 436.8 \text{ kHz}$$

$$2 \times f_{ch} < f_{is} < 2 \times n \times f_{ch}$$

The present embodiment is thus applicable.

Assume that a received digital data string is interpolated by g=12 in order to extend the sampling frequency to 436.8 kHz or more. When the interpolated digital data string is assumed to have the sampling frequency $f_s$, the following is obtained.

$$f_s = f_{is} \times g = 42.5 \text{ kHz} \times 12 = 510 \text{ kHz} > 436.8 \text{ kHz}$$

A digital data string prior to interpolation is denoted by U(1): $u_0, u_1, u_2, \ldots$ and the interpolated digital data string is denoted by V(1): $v_0, v_1, v_2, \ldots$. The interpolation unit 18 performs interpolation to satisfy the following relationships.

$$v_0 \text{ to } v_{11} = u_0$$

$$v_{12} \text{ to } v_{23} = u_1$$

$$v_{24} \text{ to } v_{35} = u_2$$

$$v_{36} \text{ to } v_{47} = u_3$$

The interpolated digital data string V(1) is exemplarily indicated to have a stepped shape as in FIG. 11. FIG. 11 exemplifies a case where a spurious digital data string is prepared and interpolation is performed assuming that y=sin(2π17000t) is an input signal to the A/D converter 28 at the sampling frequency of 42.5 kHz. The digital data string V(1) has the sampling frequency $f_s$ of 510 kHz. Accordingly, as in the configuration depicted in FIG. 10, subsequently performed is the frequency analysis in the same manner assuming that V(1) is the received digital data string having the sampling frequency $f_s$ and input to the first digital BPF 11.

Similarly to the exemplary numerical values according to the first embodiment, a spurious digital data string is prepared assuming that y=sin(2π17800t) is an input signal to the A/D converter 28 at the sampling frequency of 42.5 kHz. The frequency analysis is actually performed with the setting according to the above embodiment to obtain the exemplary numerical values of the first embodiment satisfying the values $f_{tg}$ and $T_{tg}$.

Figure 12B:
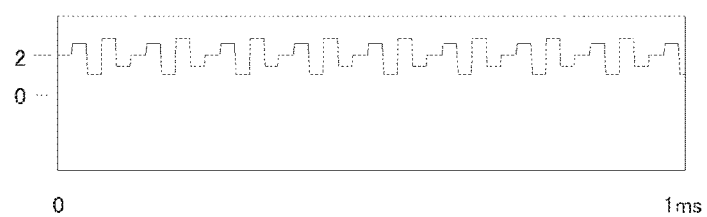
Figure 12C:
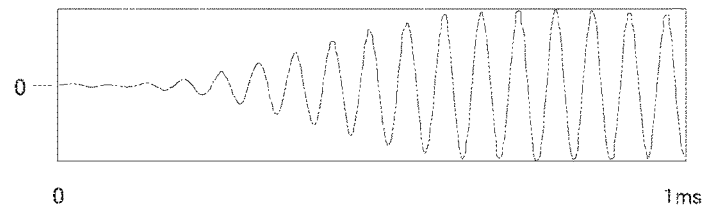

Described next with reference to FIGS. 12A to 12C is why the digital filter provided ahead of the n-th powering unit 12 is a digital band pass filter for bandpass.

FIG. 12A indicates an input signal to the A/D converter 28 expressed as y=sin(2π17000t)+2. In other words, the input signal has a sin waveform having amplitude of 1 and a frequency of 17 kHz and including a DC component of 2 which an analog filter has not completely eliminated. A digital data string input to the peak frequency detection device 1 is obtained by A/D converting this input signal at the sampling frequency of 42.5 kHz obtained by multiplying 17 kHz by 2.5.

The interpolation unit 18 extends this digital data string by interpolating by 12. FIG. 12B exemplifies a digital data string output from the interpolation unit 18. This digital data string has the sampling frequency calculated as 12×42.5 kHz=510 kHz.

FIG. 12C indicates an exemplary digital data string output from the first digital BPF unit 11 when a Butterworth IIR filter having the degree of 8 and cutoff frequencies set to $f_{cl}$=15.8 kHz and $f_{ch}$=18.2 kHz is used. The output from the first digital BPF unit 11 has a converged waveform approximate to the sin waveform while excessive DC components, excessive low-frequency component, and excessive high-frequency components output from the interpolation unit 18 being excluded.

When the first digital BPF unit 11 limits the frequency band, generation of any frequency component not expressed by [Formula 4] or [Formula 5] is inhibited when an n-th power of the output is calculated by the subsequently provided n-th powering unit 12. In other words, any digital data string including an excessive frequency component is processable by the digital band pass filter provided ahead of the n-th powering unit 12. Performance of the foregoingly provided analog filter 27 can thus be lowered to a level generating no aliasing at the subsequently provided A/D converter 28. The sampling frequency of the A/D converter 28 is also lowered. It is thus possible to achieve circuit size reduction and cost reduction.

The digital band pass filter having the cutoff frequencies $f_{cl}$ and $f_{ch}$ is alternatively configured by combining a digital high pass filter having the cutoff frequency $f_{cl}$ and a digital low pass filter having the cutoff frequency $f_{ch}$.

5. Fifth Embodiment

FIG. 13 is a block diagram depicting a configuration of a peak frequency detection device 6 according to a fifth embodiment of the present invention. The peak frequency detection device 6 includes a multiple powering unit 19 replacing the n-th powering unit 12 and the second digital BPF 13 according to the first embodiment.

As depicted in FIG. 14, the multiple powering unit 19 includes powering blocks (j) (j=1, 2, 3, . . . , and k) subordinate-connected in the order of numbers from 1 to k (k is an integer of 2 or more). The powering blocks (j) include powering units (j) each configured to $m_j$-th power ($m_j$ is an integer of 2 or more) a digital data string, and digital band pass filters (j) (BPFs (j)) each configured to extract a signal in a specific frequency band from $f_{cl}(j)$ to $f_{ch}(j)$ from an output from the corresponding powering unit (j), respectively.

The multiplier $m_j$ of the powering units (j) in the powering blocks (j) is selected to establish the following relationship as to the multiplier n of the n-th powering unit before replacement.

$$n = m_1 \times m_2 \times \ldots \times m_k$$

Furthermore, the following relationships are set.

$$f_{cl}(j) \approx (m_1 \times m_2 \times \ldots \times m_j) \times f_{cl}$$

$$f_{ch}(j) \approx (m_1 \times m_2 \times \ldots \times m_j) \times f_{ch}$$

In a case where the multiplier $m_3$ is an even number, DC components are generated by $m_j$-th powering y in accordance with [Formula 5]. The digital BPFs (j) are thus required to exclude such DC components.

As apparent in [Formula 4] and [Formula 5], when m-th powering $\sin(2\pi ft)$, the number of generated frequency components of $(m-2) \times f$ or less is decreased by decreasing the multiplier m. The subsequently provided digital BPF thus more easily inhibits frequency components outside the necessary band. The higher multiplier n is thus applicable in the present embodiment. As to a rough standard, adoption of the present embodiment will preferably be considered if the multiplier n of the n-th powering unit exceeds 16.

The desired frequency resolution $f_{tg}$ and the desired time window length $T_{tg}$ are satisfied in the present embodiment similarly to the first embodiment. Approximation calculation is not performed in the present embodiment, so that a calculated peak frequency has no accuracy deterioration.

The powering units and the second digital BPF units are provided in the multiple blocks in the present embodiment to have a more calculation amount than that of the first embodiment. However, the advantageous feature of calculation of a peak frequency with the higher multiplier n without accuracy deterioration while satisfying the desired frequency resolution $f_{tg}$ and the desired time window length $T_{tg}$ more than makes up for this disadvantage.

Described below is a case where the peak frequency detection device 6 according to the present embodiment is applied to the Doppler measuring instrument 2 depicted in FIG. 6. Necessary numerical data other than the following numerical data is assumed to have the exemplary numerical values according to the first embodiment. For easier description hereinafter, assume that n=12, $f_s$=510 kHz, N=4096, and $n = m_1 \times m_2$ as in the first embodiment. Furthermore, assume that $m_1$=4 and $m_2$=3.

A spurious digital data string is prepared assuming that $y = \sin(2\pi 17800t)$ is an input signal to the A/D converter 28 at the sampling frequency of 510 kHz. The digital data string is input to the first digital BPF 11, and an output from the first digital BPF 11 is denoted by A(1): $a_0, a_1, a_2, \ldots$.

The powering unit (1) fourth-powers each element of digital data string A(1), and the digital data string having passed through the powering unit (1) is denoted by B(4): $b_0, b_1, b_2, \ldots$.

In other words, $b_i = (a_i)^4$ (i=0, 1, 2, 3, 4, . . . ) is established.

This digital data string B(4) is caused to pass through the digital BPF (1), and the digital data string having passed through the digital BPF (1) is denoted by C(4): $c_0, c_1, c_2, \ldots$. Assume that the digital BPF (1) is a Butterworth IIR filter having the degree of 8 and cutoff frequencies of 63.2 kHz ($4 \times f_{cl}$) and 72.8 kHz ($4 \times f_{ch}$).

The powering unit (2) subsequently cubes each element of the digital data string C(4), and the digital data string having passed through the powering unit (2) is denoted by D(12): $d_0, d_1, d_2, \ldots$. In other words, $d_i = (c_i)^3$ (i=0, 1, 2, 3, 4, . . . ) is established.

This digital data string D(12) is caused to pass through the digital BPF (2), and the digital data string having passed through the digital BPF (2) is denoted by E(12): $e_0, e_1, e_2, \ldots$. Assume that the digital BPF (2) is a Butterworth IIR filter having the degree of 8 and cutoff frequencies of 189.6 kHz ($4 \times 3 \times f_{cl}$) and 218.4 kHz ($4 \times 3 \times f_{ch}$).

A frequency of the digital data string E(12) is obtained by means of FFT of the sampling frequency $f_s$=510 kHz and the sample number N=4096. The frequency satisfied a relationship $(12 \times f') \approx 213662.1$ Hz. The value f' to be obtained is calculated as $f' = (12 \times f')/12 \approx 17805.2$ Hz. The value f' is calculated while satisfying the value $f_{tg}$. Here, the error c from a theoretical value f=17800 Hz is actually $\epsilon = f' - f = 17805.2 - 17800 = 5.2$ Hz within the range of $\pm (f_{tg})/2 = \pm 12/2 = \pm 6$ Hz.

As in the first embodiment, the time window length has a relationship $N/f_s = 4096/510$ kHz $= 8.0$ ms $< T_{tg} = 10$ ms, satisfying the desired time window length $T_{tg}$.

6. Sixth Embodiment

Figure 15:
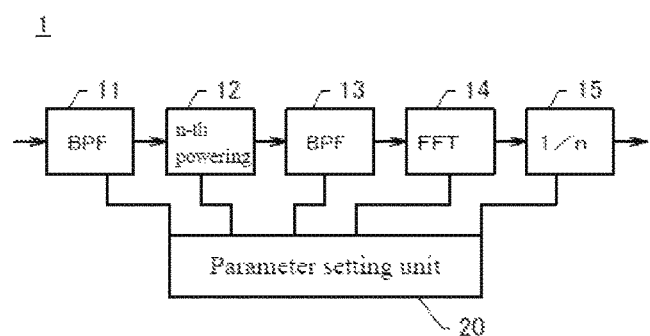
FIG. 15 is a block diagram according to still another embodiment of the present invention.

The peak frequency detection device 1, 3, 4, 5, or 6 described earlier optionally further includes a parameter setting unit. FIG. 15 is a block diagram depicting a configuration of the peak frequency detection device 1 according to the first embodiment further including a parameter setting unit 20. The parameter setting unit 20 is embodied by a computer including a processor, a memory, and an input/output mechanism. The parameter setting unit 20 is configured to set a parameter value for the peak frequency detection device 1, 3, 4, 5, or 6 in accordance with user input through an operation unit (not depicted) such as a keyboard, a mouse, or a touch panel display. There are the following parameters as described earlier.

the sampling frequency $f_{is}$ of a received digital data string
the sampling frequency $f_s$ of a digital data string
the desired frequency resolution $f_{tg}$
the desired time window length $T_{tg}$
the multiplier n of the n-th powering unit (n is an integer of 2 or more)
the frequency band substantially from $f_{cl}$ to $f_{ch}$ ($f_{cl} < f_{ch}$) of the first digital BPF the frequency band substantially from $n \times f_{cl}$ to $n \times f_{ch}$ of the second digital BPF the FFT sampling frequency $f_s$ the FFT sampling number N For example, the parameter setting unit 20 is configured to preliminarily store, in the memory, all the parameter numerical values in association with user selectable input values and set a parameter in accordance with the user input value. The parameter setting unit 20 is alternatively configured to preliminarily store, in the memory, part of the parameter numerical values in association with user selectable input values to set a parameter in accordance with user input and cause the processor to calculate a remaining parameter in accordance with an input numerical value.

Figure 16:
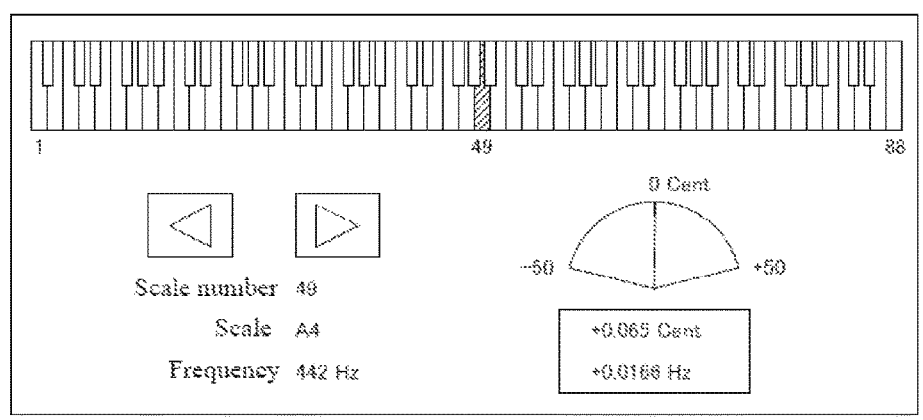
FIG. 16 is a screen configuration diagram according to the embodiment of the present invention.

Described in the present embodiment is a peak frequency detection device used as tuning auxiliary equipment configured to cause a user to input only a scale number associated with a frequency and acquire, from a memory, all parameter numerical values in accordance with the input scale number to set parameters. Specifically, the parameter setting unit 20 acquires, from the memory, parameter numerical values associated with an input of one of scale numbers 1 to 88 to set parameters. FIG. 16 is an exemplary screen configuration diagram of a touch panel display in a state of receiving a scale number. All the parameter numerical values are preliminarily determined in accordance with a scale number P and are stored in a nonvolatile memory. The scale numbers are associated with keys of an equally tempered piano. The scale number 1 is associated with a frequency of the lowest tone whereas the scale number 88 is associated with a frequency of the highest tone. In other words, a value determined in accordance with [Formula 21] as the frequency $f_p$ associated with the scale number P is preliminarily stored in the nonvolatile memory.

$$f_p = 27.625 \times 2^{\frac{P-1}{12}} \text{ (Hz)} \quad \text{[Formula 21]}$$

Numerical values of the parameters associated with P=49 ($f_p$=442 Hz) are set as follows.

$$f_s = 24 \text{ kHz} \quad \text{[Formula 22]}$$

$$f_{tg} = f_p\left(2^{\frac{2}{1200}} - 1\right) = 0.510913481 \text{(Hz)}$$

$$T_{tg} = (1/0.510913481)/10 = 0.195727855 \text{ s}$$

$$n = 16$$

$$f_{cl} = f_p \div 2^{\frac{50}{1200}} = 429.417118 \text{(Hz)}$$

$$f_{ch} = f_p \times 2^{\frac{50}{1200}} = 454.9515886 \text{(Hz)}$$

$$n \times f_{cl} = 16 \times f_{cl} = 6870.673888 \text{ Hz}$$

$$n \times f_{ch} = 16 \times f_{ch} = 7279.225418 \text{ Hz}$$

$$N = 4096$$

The value $f_{tg}$ denotes the frequency corresponding to 2 cents of $f_p$. A cent value indicates a frequency ratio between two scales by logarithmic expression, as widely known, and 100 cents correspond to a semitone of equally tempered 12 scales. The value $T_{tg}$ corresponds to 1/10 of a time window length ($1/f_{tg}$). The value $f_{cl}$ indicates a frequency below $f_p$ by 50 cents. The value $f_{ch}$ indicates a frequency above $f_p$ by 50 cents. The value N is required to be an integer of a power of 2 from $f_s/(n \times f_{tg})$=24000/(16×0.5109)≈2936 to $f_s \times T_{tg}$= 24000×0.1957≈4697.

The parameter setting unit 20 is configured to set all the parameter numerical values in accordance with the input scale number P with such preliminary definition. A peak frequency of a received digital data string can be calculated by using the parameters thus set. A digital data string to be input to the peak frequency detection device 1 may be sequentially input on a real time basis through a microphone (not depicted) and the A/D converter (not depicted), or may be stored in the memory.

Assuming that P=49 ($f_p$=442 Hz), a spurious digital data string is prepared with y=sin(2π442t) sampled at the sampling frequency of 24 kHz. The frequency analysis is actually performed to obtain the relationship 16×f'≈7072.2656 Hz. The value f' to be obtained is calculated as f'=(16×f')/16≈442.0166 Hz. The obtained peak frequency has a frequency resolution satisfying the desired frequency resolution $f_{tg}$. The error ε from a theoretical value f=442 Hz in this case is actually calculated as ε=f'−f=442.0166−442=0.0166 Hz within the range of ±($f_{tg}$/2)= ±0.5109/2≈±0.255 Hz. The time window length is obtained as $N/f_s$=4096/24 kHz=0.171 s, satisfying the desired time window length $T_{tg}$=0.195 s. The obtained peak frequency may be output by the unit Hz or by the cent value associated with fp=442 Hz (+0.065 cents).

7. Effects

Each of the above embodiments of the present invention enables detection of a peak frequency of a signal wave at the desired frequency resolution $f_{tg}$ in the desired time window length $T_{tg}$ while avoiding the conflicting relationship $f_0=1/T_0$ between the frequency resolution ($f_0$) and the time window length ($T_0$) as a constraint on the FFT frequency analysis. If a sampling frequency of a received digital data string is larger than $2 \times f_{ch}$ or more, a peak frequency can be calculated. There is no need to perform processing such as approximation calculation, curve fitting, or averaging, so that peak frequency calculation has no accuracy deterioration.

Even in a case where an input signal includes a component (a DC component, a low-frequency component, or a high-frequency component) in an excessive frequency band, has a deteriorated S/N ratio, or has almost no amplitude, the first and second digital BPFs extract a frequency component in a band necessary for peak frequency calculation and therefore a peak frequency can be calculated unproblematically. Hardware provided ahead of the peak frequency detection device can thus be lowered in required specification to achieve reduction in size and cost. Specifically, a peak frequency can be calculated in a case where an input signal has a sampling frequency of larger than $2 \times f_{ch}$ or more relatively to the cutoff frequency $f_{ch}$ of the first digital BPF. Foregoingly provided hardware such as the analog filter or the A/D converter can thus be lowered in required specification. If the larger multiplier n is set to the powering unit, the digital band pass filter can have a larger degree to achieve steepness for durability against exogenous noise.

8. Other Embodiments

The present invention has a technical scope not limited to the embodiments described above, but can obviously be modified in various manners within the range not departing from the gist of the present invention.

For example, although the digital BPF is exemplified by the Butterworth IIR filter having the degree of 8, a filter in a different form is also preferably applicable. Preferably applicable examples of the filter include a finite impulse response (FIR) filter and a Chebyshev filter. Furthermore, the degree is not limited to 8. The cutoff frequencies can be set to have wider or narrower extracted range in accordance with a condition. In a case where an input signal has amplitude around 0 and includes substantially no high-harmonic component (i.e. a signal having a single frequency approximate to a sin curve), the first digital BPF is replaceable with a low pass filter.

Although the present invention has been described with exemplary application to Doppler frequency detection in a reflective echo or to tuning auxiliary equipment, application of the present invention is not limited to this range. The present invention is applicable widely typically to detection of a peak frequency of a signal wave by means of FFT.

Each of the functional units according to the above embodiments can be embodied by a single or a plurality of large scale integrations (LSIs), whereas a plurality of functional units can be embodied by a single LSI. Integration is not limitedly achieved by an LSI but can be embodied by a dedicated circuit or a general purpose processor. Also applicable is a field programmable gate array (FPGA) programmable after LSI production or a reconfigurable processor having reconfigurable connection or setting of a circuit cell inside an LSI. If there is achieved a circuit integration technique replacing an LSI through a developed semiconductor technique or a separate derivative technique, functional blocks can obviously be integrated in accordance with the technique.

REFERENCE SIGNS LIST

1 Peak frequency detection device
2 Doppler measuring instrument
3 Peak frequency detection device
4 Peak frequency detection device
5 Peak frequency detection device
6 Peak frequency detection device
11 First digital BPF unit
12 n-th powering unit
13 Second digital BPF unit
14 FFT unit
15 1/n multiplication unit
16 Decimation unit
17 Decimation unit
18 Interpolation unit
19 Multiple powering unit
20 Parameter setting unit
21 Transceiver
22 Transmission/reception switch circuit
23 Transmission circuit
24 Reception amplifier
25 Modulator
26 Local oscillation circuit
Analog filter
A/D converter

The invention claimed is:

1. A system, comprising
a signal receiver that receives a signal wave including disturbance noise;
an analog/digital converter that converts the received signal wave into a digital signal; and
a peak frequency detection device configured to detect a peak frequency having a maximum power spectrum in a predetermined frequency band $f_{cl}$ to $f_{ch}$ of the digital signal and output the peak frequency, the device comprising:
an n-th powering unit configured to n-th power, n is an integer of 2 or more, each element of a digital data string;
an FFT unit configured to derive, as a virtual peak frequency, a frequency corresponding to the maximum power spectrum that is obtained by applying fast Fourier transform to N, N is an integer of a power of 2 and is determined in accordance with a sampling frequency $f_s$, a frequency resolution $f_{tg}$, and a time window length $T_{tg}$, n-th powered digital data strings having the sampling frequency $f_s$; and
a 1/n multiplication unit configured to output a value obtained by multiplying the virtual peak frequency by 1/n as a peak frequency of a digital data string, wherein the device satisfies $$n \geq 1/(f_{tg} \times T_{tg})$$

$$f_s/(n \times f_{tg}) \leq N \leq f_s \times T_{tg}$$

$$f_s > 2 \times n \times f_{ch}.$$

2. The system according to claim 1, further comprising
a first digital band pass filter configured to extract a digital data string having a frequency included in the predetermined frequency band, wherein
the n-th powering unit receives an output from the first digital band pass filter.

3. The system according to claim 2, further comprising
a decimation unit configured to decimate a digital data string having a sampling frequency $f_{is}$ to 1/r, r is an integer of 2 or more, to obtain the sampling frequency $f_s$, wherein
the first digital band pass filter receives an output from the decimation unit.

4. The system according to claim 2, further comprising
an interpolation unit configured to interpolate the digital data string by g, g is an integer of 2 or more, to obtain the sampling frequency $f_s$, wherein
the first digital band pass filter receives an output from the interpolation unit.

5. The system according to claim 1, further comprising
a second digital band pass filter configured to extract a digital data string included in a second frequency band from the N n-th powered digital data strings, wherein
the FFT unit receives the digital data string extracted by the second digital band pass filter, and
the second frequency band is substantially from $n \times f_{cl}$ to $n \times f_{ch}$.

6. The system according to claim 5, further comprising
a decimation unit configured to decimate the digital data string extracted by the second digital band pass filter to 1/r, r is an integer of 2 or more, to obtain the sampling frequency $f_s$, wherein
the FFT unit receives an output from the decimation unit.

7. The system according to claim 1, further comprising:
a first digital band pass filter configured to extract a digital data string having a frequency included in the specific frequency band; and
a second digital band pass filter configured to extract a digital data string included in a second frequency band from an output from the n-th powering unit, wherein
the n-th powering unit receives an output from the first digital band pass filter, the FFT unit receives an output from the second digital band pass filter, and
the second frequency band is substantially from $n \times f_{cl}$ to $n \times f_{ch}$.

8. The system according to claim 1, comprising
in place of the n-th powering unit, a multiple powering unit including k, k is an integer of 2 or more, powering blocks j, j=1, 2, . . . , and k, provided with powering units j each configured to $m_j$-th power, $m_j$ is an integer of 2 or more, a received digital data string, and digital band pass filters j each configured to extract a signal in a specific frequency band from $f_{cl}(j)$ to $f_{ch}(j)$ from an output from the corresponding powering unit j, respectively, wherein
the device satisfies $$n = m_1 \times m_2 \times \ldots \times m_k$$

$$f_{cl}(j) \approx (m_1 \times m_2 \times \ldots \times m_j) \times f_{cl}$$

$$f_{ch}(j) \approx (m_1 \times m_2 \times \ldots \times m_j) \times f_{ch}.$$

9. The system according to claim 1, further comprising:
an operation unit configured to receive a user command; and
a parameter setting unit configured to set at least one of values n, $f_s$, and N according to the command.

10. A peak frequency detection method; comprising:
receiving a signal wave including disturbance noise;
converting the received signal wave into a digital signal by an analog/digital converter; and
detecting a peak frequency having a maximum power spectrum in a predetermined frequency band $f_{cl}$ to $f_{ch}$ of the digital signal by n-th powering, n is an integer of 2 or more, each element of a digital data string;
deriving, as a virtual peak frequency, a frequency corresponding to the maximum power spectrum that is obtained by applying fast Fourier transform to N, N is an integer of a power of 2 and is determined in accordance with a sampling frequency $f_s$, a frequency resolution $f_{tg}$, and a time window length $T_{tg}$, n-th powered digital data strings having the sampling frequency $f_s$;
outputting a value obtained by multiplying the virtual peak frequency by 1/n as a peak frequency of a digital data string, and
outputting the peak frequency, wherein
the method satisfies $$n \geq 1/(f_{tg} \times T_{tg})$$

$$f_s/(n \times f_{tg}) \leq N \leq f_s \times T_{tg}$$

$$f_s > 2 \times n \times f_{ch}.$$

11. A non-transitory computer readable medium including a peak frequency detection program configured to detect a peak frequency having a maximum power spectrum in a predetermined frequency band $f_{cl}$ to $f_{ch}$ from a digital signal, wherein a received signal wave including disturbance noise is converted to a digital signal by an analog/digital converter;
converting the received signal wave into a digital signal;
the program causing a computer to function as:
an n-th powering unit configured to n-th power, n is an integer of 2 or more, each element of a digital data string;
an FFT unit configured to derive, as a virtual peak frequency, a frequency corresponding to the maximum power spectrum that is obtained by applying fast Fourier transform to N, N is an integer of a power of 2, and is determined in accordance with a sampling frequency $f_s$, a frequency resolution $f_{tg}$, and a time window length $T_{tg}$, n-th powered digital data strings having the sampling frequency $f_s$;
a 1/n multiplication unit configured to output a value obtained by multiplying the virtual peak frequency by 1/n as a peak frequency of the digital data string, and
an output unit that outputs the peak frequency, wherein
the program satisfies $$n \geq 1/(f_{tg} \times T_{tg})$$

$$f_s/(n \times f_{tg}) \leq N \leq f_s \times T_{tg}$$

$$f_s > 2 \times n \times f_{ch}.$$

* * * * *